(12) United States Patent
Margittai (10) Patent No.: US 7,612,622 B2
(45) Date of Patent: Nov. 3, 2009

(54) METHOD AND DEVICE FOR DETERMINING A DUTY CYCLE OFFSET

(75) Inventor: Gavril Margittai, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 12/056,783

(22) Filed: Mar. 27, 2008

(65) Prior Publication Data
US 2009/0243734 A1    Oct. 1, 2009

(51) Int. Cl.
*H03K 3/03* (2006.01)
(52) U.S. Cl. ............................ 331/57; 327/161; 327/263
(58) Field of Classification Search ................... 331/57; 327/161, 263
See application file for complete search history.

(56) References Cited

U.S. PATENT DOCUMENTS

| 6,232,845 | B1 * | 5/2001 | Kingsley et al. | 331/57 |
| 6,710,637 | B1 * | 3/2004 | Chan | 327/259 |
| 6,958,659 | B2 * | 10/2005 | Nakajima | 331/57 |
| 2008/0309417 | A1 * | 12/2008 | Bonwick et al. | 331/57 |

* cited by examiner

*Primary Examiner*—Joseph Chang
*Assistant Examiner*—Jeffrey Shin
(74) *Attorney, Agent, or Firm*—Blakely, Sokoloff, Taylor & Zafman LLP (57) ABSTRACT

Embodiments of the present invention relate to a method and device operable to determine a duty cycle offset of a periodic signal and correct the periodic signal to a desired duty cycle. Embodiment of the present invention may include a ring oscillator circuit. The ring oscillator includes an odd number of ordered inverting elements. One or more of the inverting elements may be an inverting memory element. Each inverting element's output port (except the last inverting element) may be operably connected to the subsequent inverting element's input port. The last inverting element's output port may be operably connected to the first inverting element's input port, thereby forming a chain or ring. A counter may be incremented by oscillations of an output port of an inverting element during a high portion of a periodic signal and may be decremented by oscillations of the output port of the inverting element during a low portion of the periodic signal. The end result in the counter may be proportional to the duty cycle offset of the periodic signal. The end value may then be used to correct the duty cycle of the periodic signal to a desired duty cycle offset.

15 Claims, 4 Drawing Sheets

METHOD AND DEVICE FOR DETERMINING A DUTY CYCLE OFFSET

BACKGROUND

1. Technical Field

The present invention relates to a method and device operable to determine a duty cycle offset of a periodic signal. More specifically, the present invention relates to a method and device operable to determine a duty cycle offset of a periodic signal and correct the periodic signal to a desired duty cycle.

2. Description of the Related Art

The "duty cycle" of a periodic signal is the fraction of the time the periodic signal is at logic '1' over the period of the periodic signal. Thus, if a periodic signal is at logic '1' for 100 picoseconds and has a period of 400 picoseconds, the periodic signal has a duty cycle of 25%. If the periodic signal had a period of 200 picoseconds and the periodic signal is at logic '1' for 100 picoseconds, the duty cycle is 50%. When the duty cycle is 50%, the periodic signal is at logic '1' for the same length of time it is at logic '0'. The periodic signal may be a clock signal. In such a case, the period of the clock signal may also be referred to as a "clock cycle". The term "clock high" refers to when a clock signal is at logic '1'. The term "clock low" refers to when a clock signal is at logic '0'.

Keeping a 50% duty cycle for the main clock in a processor (and for other high frequency clocks in the processor) is one of the most potent ways of increasing the clock frequency for the processor and decreasing the impact of phase paths within the processor. A "phase path" occurs when a signal does not have an entire clock period to propagate. For example, a signal may be clocked out of a first flip flop on a rising edge of a clock and need to propagate to a second flip flop to be clocked in on a falling edge of the clock. Thus, if the clock period is 250 picoseconds and the signal requires at least 100 picoseconds to propagate, then a duty cycle of less than 40% will severely impact this phase path.

When the duty cycle of a clock is not equal to a desired duty cycle, the duty cycle is said to have an "offset". The desired duty cycle is typically 50%. The offset is an amount of time the logic '1' portion of the clock is above or below the amount of time necessary for the desired duty cycle. If the desired duty cycle is 50%, for a clock having a period of 200 picoseconds, 50% duty cycle is logic '1' for 100 picoseconds. If the duty cycle is actually 40%, the offset is −20 picoseconds (i.e., the logic '1' portion of the clock is only 80 picoseconds). If the duty cycle is actually 55%, the offset is +10 picoseconds. An offset may also be referred to as an "excursion".

Significant duty cycle offsets for the main processor clock were observed by the silicon debug teams for the Intel Merom and Penryn chipsets. It has been proven by the silicon debug teams for both the Merom and Penryn chipsets that tuning the duty cycle of the processor clock closer to 50% enhances the performance of the chip. Currently this is accomplished using fuses which store control information for a chain of inverting elements having controllable P/N ratios. The deficiency of this method is that each individual chip requires a different fuse setting due to the variability and unpredictability of the process.

Measuring the duty cycle of each individual chip in a production environment is difficult and expensive. Furthermore, burning different fuse content based on these measurements is also expensive.

Directly measuring the time difference between the logic '1' portion and the logic '0' portion of a clock is quite difficult. One problem with measuring a clock's duty cycle is the need to measure incredibly small amounts of time using very imprecise elements that have coarse resolution. For example, transistor properties are impacted by process variation, within die variation, voltage variation, etc.

Until now, the measurement of the duty cycle was performed only with instruments external to the chip. For example, a production tester may test a processor over a range of frequencies (such a process is referred to as "frequency shmoo"). No solution exists for detecting a duty cycle internal to the chip. Furthermore, no solution exists for detecting a duty cycle which is workable on silicon.

BRIEF DESCRIPTION OF THE DRAWINGS

Embodiments of the present invention will be understood and appreciated more fully from the following detailed description in conjunction with the figures, which are not to scale, in which like reference numerals indicate corresponding, analogous or similar elements, and in which.

DETAILED DESCRIPTION

In the following detailed description, numerous specific details are set forth in order to provide a thorough understanding of the subject matter disclosed herein. However, it will be understood by those of ordinary skill in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification, discussions utilizing terms such as "processing," "computing," "calculating," "determining," "comparing", or the like, may refer to the action and/or processes of a processor, computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computer, communication device or other apparatus. Embodiments of the present invention are not described with reference to any particular programming language, machine code, or the like.

Embodiments of the present invention may include a computer program stored in a computer readable storage medium, such as, but is not limited to, any type of disk including floppy disks, optical disks, magnetic-optical disks, read-only memories, compact disc read-only memories, random access memories, electrically programmable read-only memories, electrically erasable and programmable read only memories, magnetic or optical cards, or any other type of media suitable for storing electronic instructions, and capable of being coupled to a computer system bus.

Embodiments of the present invention may include digital logic signals. These logic signals may be described as having a certain logic level, for example, logic '1' or logic '0'. As is understood by those skilled in the art, this is done merely for illustrative purposes to clarify an embodiment of the invention and is not meant to indicate that only the indicated logic level is operable. For example, if a circuit has an input which is used to enable the circuit, the input signal may be described as being logic '1' to enable the circuit and logic '0' to disable the circuit. However, those skilled in the art will recognize that this is true only if the circuit's enable input is active-high. In another embodiment, the circuit's enable input may be active-low in which case a logic '0' input will enable the circuit and a logic '1' will disable the circuit. Because such alternatives are well-known by those of ordinary skill in the art, only a single embodiment may be described herein. However, other embodiments having different logic levels are considered a part of the present invention.

Figure 1:
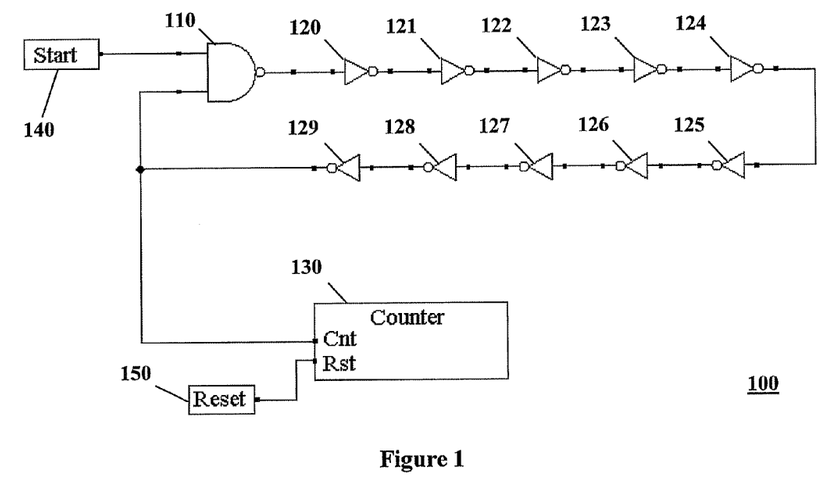
FIG. 1 shows a ring oscillator circuit according to an embodiment of the present invention.

FIG. 1 shows a ring oscillator circuit 100 according to an embodiment of the present invention. The ring oscillator circuit may have an odd number of ordered inverting elements. An "inverting element" is any device or element that is capable of inverting a signal to form an inverted version of the signal. An inverting element may have an input port and an output port. The inverting element may produce at its output port an inverted version of the signal at its input port. An inverting element may also have an enable port. When enabled, the inverting element may produce at its output port an inverted version of the signal at its input port. When disabled, the inverting element may output a constant logic level regardless of the value at its input port. A first inverting element 110 may comprise a NAND gate. A second through eleventh inverting element 120-129 may comprise NOT gates. The inverting elements may be arranged in a ring. In the ring each inverting element's output port (except for the last inverting element) may be operably connected to the subsequent inverting element's input port. Thus, the output port of the first inverting element 110 may be operably connected to the input port of the second inverting element 120. The output port of the second inverting element 120 may be operably connected to the input port of the third inverting element 121, etc. In the ring the last inverting element's output port may be operably connected to the first inverting element's input port, thereby completing the ring. Thus, the output of the last inverting element 129 may be operably connected to the input port of the first inverting element 110. The input port of the first inverting element may also be connected to a starter 140 which produces a start/stop signal.

The ring oscillator may be started by the starter 140 setting the start/stop signal to logic '0' which forces the first inverting element 110 to output a logic '1' after a delay (e.g., a propagation delay). The starter may then set the start/stop signal to logic '1'. The logic '1' from the first inverting element propagates to the second inverting element which outputs a logic '0' after a delay. The logic '0' propagates to the third inverting element which outputs a logic '1' after a delay. Because there are an odd number of inverting elements, the output from the last inverting element is a logic '1', which is input to the first inverting element after a delay. This causes the first inverting element to output a logic '0' after a delay. As can be readily seen, due to the odd number of inverting elements, a sequence of logic 101010 . . . propagates through the ring oscillator. Thus, the starter may cause the output ports of the inverting elements to oscillate. The ring oscillator may be stopped by the starter leaving the start/stop signal at logic '0' which prevents the ring oscillator from oscillating.

A counter 130 may be connected to the output port of any inverting element. In some embodiments of the present invention, the counter 130 may be connected to the output port of the last inverting element. The counter may be capable of either incrementing its count or decrementing its count. The counter may increment or decrement on a rising edge or a falling edge of its input. If there are n number of inverting elements, every inverting element has the same delay (e.g., a propagation delay) of d seconds, and the counter only increments on a rising edge of the output of the inverting element, the counter will only increment once every 2*n*d seconds. Thus, the period of the ring oscillator is 2*n*d seconds and the output of any inverting element changes once every n*d seconds. The counter may be reset to zero by a reset device 150.

Figure 2:
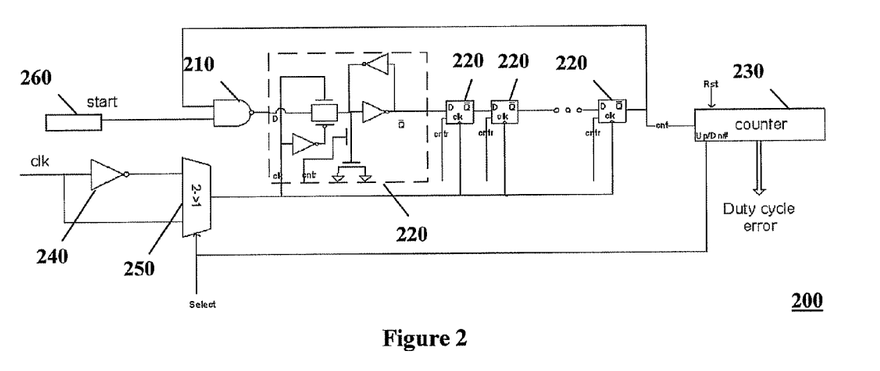
FIG. 2 shows a ring oscillator circuit useful for measuring a duty cycle offset according to an embodiment of the present invention.

FIG. 2 shows a ring oscillator circuit 200 useful for measuring a duty cycle offset according to an embodiment of the present invention. The ring oscillator circuit has an odd number of ordered inverting elements. The ring oscillator circuit 200 may contain any number or order of inverting elements such as: NAND gates, NOR gates, NOT gates, or inverting memory elements as long as the total number of inverting elements is odd.

An "inverting memory element" is an inverting element that inverts its input when enabled and latches its previous input when disabled. A high phase inverting memory element inverts its input when the enable signal is logic '1' and latches its previous input when the enable signal is logic '0'. A low phase inverting memory element inverts its input when the enable signal is logic '0' and latches its previous input when the enable signal is logic '1'. In an embodiment of the present invention, the inverting memory element may be a "transparent D latch". The transparent D latch has an input port, D, an enable port, Clk, and an output port $\overline{Q}$. For a high phase transparent D latch, when the Clk enable is logic '1', $\overline{Q}$ reflects an inverted version of the D input. When the Clk enable is logic '0', the value of $\overline{Q}$ is latched (is equal to the inverted version of the previous value of D) and does not change even if the D input changes.

In embodiments of the present invention, in the ring oscillator circuit 200 at least one of the inverting elements is an inverting memory element 220. In some embodiments of the present invention, every inverting element is an inverting memory element. In some embodiments of the present invention, the inverting memory element may comprise a transparent D latch. The first inverting element 210 may comprise a NAND gate. Alternatively, the NAND gate may be incorporated into one of the inverting memory elements. As explained above in reference to FIG. 1, the inverting elements may be arranged in a ring. In the ring, each inverting element's output port (except for the last inverting element)

may be operably connected to the subsequent inverting element's input port and the last inverting element's output port may be operably connected to the first inverting element's input port. The input port of the first inverting element may also be operably connected to a starter 260 which produces a start/stop signal.

The ring oscillator circuit may have an inverter 240 that inverts the periodic signal to form an inverted periodic signal without affecting the periodic signal's duty cycle. The inverter may be a "perfectly symmetrical inverter". While there is no such thing as a "perfectly symmetrical inverter", per se, an inverter can be designed to be sufficiently symmetrical within approximately 1-2 picoseconds or less. The imperfection of the "perfect inverter" may add to the inaccuracy of the ring oscillator circuit, but the duty cycle offset is usually greater than this imperfection. The delay of the inverter 240 does not matter. Instead, in embodiments including a "perfectly symmetrical inverter", the inverter's input rise time should be as identical as possible with its output fall time. Similarly, the inverter's input fall time should be as identical as possible with its output rise time. An inverter that comes close to these requirements may be found in existent PLL blocks.

A switch 250 may be used to operably connect a periodic signal (such as a clock signal, for example) to the enable ports of the inverting elements in a first state of the switch. The switch 250 may be used to operably connect an inverted periodic signal (such as an inverted clock signal, for example) to the enable ports of the inverting elements in a second state of the switch. The switch may be a 2:1 mux.

The output port of one of the inverting elements in the ring oscillator is connected to the input of a counter 230. In some embodiments of the present invention, the counter 230 may be connected to the output port of the last inverting element. The counter increments on the rising edge (or falling edge, if desired) of this output. Thus, in embodiments of the present invention the counter may count the number of oscillations (e.g., rising edges) of the last inverting element's output (although the oscillations of any inverting element's output, inverting memory element's output, or transparent D latch's output may be counted instead). The counter may have a control signal, up/down, which may be used to either increment or decrement the counter for each oscillation at the counter's input. The counter may have a control signal, reset, which may be used to reset the counter to zero.

The counter may operate to count a first number of oscillations of the output port of an inverting element during the high (logic '1') portion of the periodic signal (i.e., the first state of the switch). For this first state of the switch, the counter's up/down control signal may be set to increment. The switch 250 may be used to operably connect the periodic signal to the enable ports of the inverting elements in a first state of the switch. As before, the oscillations of the output port of the inverting element may be started by the starter 260 setting the start/stop signal to logic '0' which forces the first inverting element to output a logic '1' after a delay (e.g., a propagation delay). The starter may set the start/stop signal to logic '0' when the periodic signal is at its rising edge (i.e., the start/stop signal is set to logic '0' at the same time the periodic signal becomes logic '1'). The starter may then set the start/stop signal to logic '1'. As before, a sequence of logic 101010 . . . may propagate through the ring oscillator as long as the periodic signal is at logic '1'. The ring oscillator may not oscillate when the input to its enable port is logic '0'. In an embodiment of the present invention, since the inverting memory elements latch when the periodic signal is at logic '0', the ring oscillator may not oscillate in this case. Thus, the starter may cause the output ports of the inverting elements to oscillate. The ring oscillator may be stopped by the starter leaving the start/stop signal at logic '0' which prevents the ring oscillator from oscillating.

As before, if there are n number of inverting elements, every inverting element has the same delay (e.g., a propagation delay) of d seconds, and the counter only increments on a rising edge, the counter will only increment once every 2*n*d seconds. However, the periodic signal is only at logic '1' for h seconds. It is assumed that a latch will correctly output its output signal if the input signal exists on its input port for at least a predetermined fraction of its delay time, such as half. It is further assumed that if the input signal exists on the latch's input port for less than the predetermined fraction of its delay time, the output of the latch will not change. If the predetermined fraction is one half, the total number of inversions of all of the inverting elements in the ring oscillator circuit is ROUND(h/d) per periodic signal cycle, where the ROUND function rounds to the ones place and will increment the ones place if the tenths place is 5 or greater and the ROUND function leaves the ones place at its present value if the tenths place is 4 or less.

The counter may be incremented only if the output of the last inverting element has a rising edge (i.e., if every inverting element but the last inverting element has a rising edge, the counter will not increment). Thus, the counter is incremented INT(ROUND(h/d)/(2*n)) times per periodic signal cycle, where the INT function rounds down to the nearest integer. Thus, if h is 170 picoseconds, d is 8.8 picoseconds, and n is 3, INT(ROUND(h/d)/(2*n)) equals INT(ROUND(19.3)/(6)) which equals INT(3.17) which equals 3. If there are instead 5 inverting elements, INT(ROUND(h/d)/(2*n)) equals INT(ROUND(19.3)/(10)) which equals INT(1.93) which equals 1.

After counting a first number of oscillations for the high (logic '1') portion of the periodic signal, the ring oscillator circuit may count a second number of oscillations for the low (logic '0') portion of the periodic signal. For this second state of the switch, the counter's up/down control signal may be set to decrement. The switch 250 may be used to operably connect the inverted periodic signal from the inverter 240 to the enable ports of the inverting elements in a second state of the switch. The starter may restart the start/stop signal (i.e., set it to logic '0') on the falling edge of the periodic signal (the rising edge of the inverted periodic signal). The starter may then set the start/stop signal to logic '1'. The ring oscillator operates as before. However, because the enable signal to the inverting elements is from the inverted periodic signal, the ring oscillator now oscillates based on the low (logic '0') portion of the periodic signal (and will not oscillate during the logic '1' portion of the periodic signal). In embodiments of the present invention in which one or more of the inverting memory elements are transparent D latches, the transparent D latches still propagate an inverted version of their D inputs to their $\overline{Q}$ outputs when their Clk enable is logic '1', however, the Clk enable is logic '1' when the periodic signal is logic '0' due to the inverter and the switch.

Using the parameters above (d is 8.8 picoseconds, n is 3) if the periodic signal is at logic '1' for 170 picoseconds, a first number of oscillations in the first state of the switch is 3 (and the counter may be incremented by this amount). If the periodic signal is at logic '0' for 150 picoseconds, a second number of oscillations in the second state of the switch is 2 (and the counter may be decremented by this amount). Thus, the end value of the counter (the difference between the first number of oscillations and the second number of oscillations) may indicate a difference between the high portion and the low portion of the periodic signal. This end value may be proportional to the actual duty cycle offset of the periodic signal. It is to be understood that the order of incrementing and decrementing the counter is unimportant. For example, the counter may be decremented for the high portion of the periodic signal and incremented for the low portion of the periodic signal.

Figure 3:
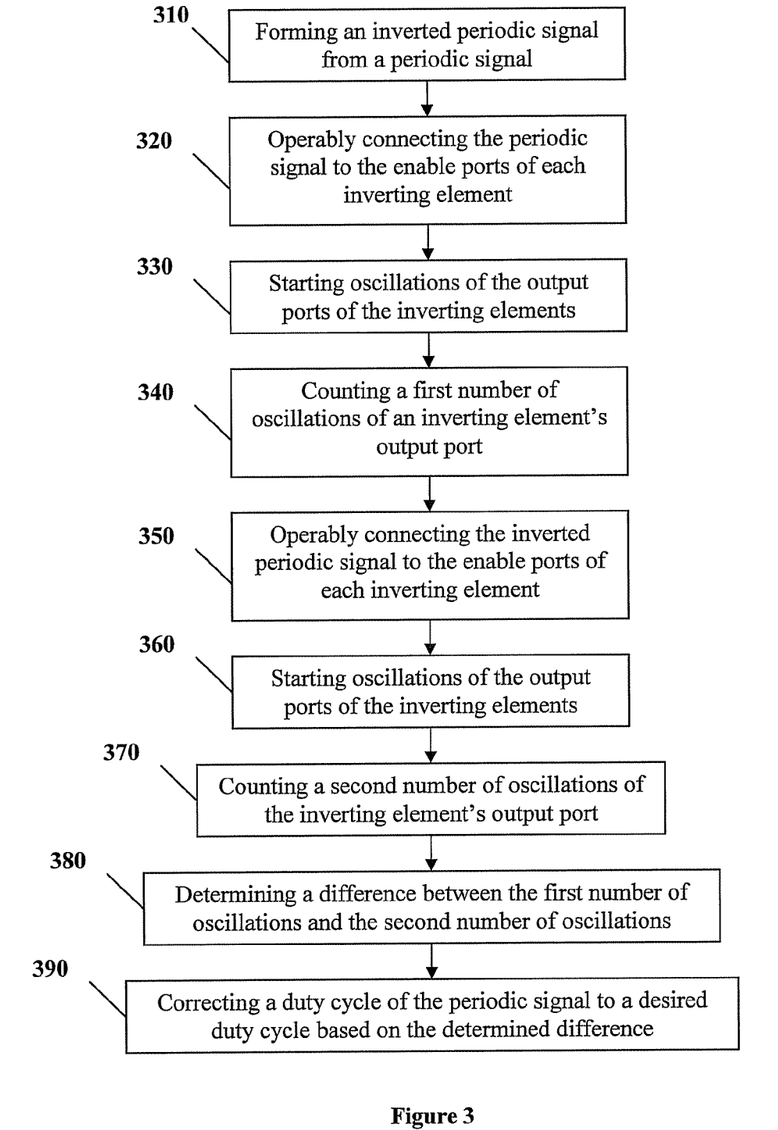
FIG. 3 shows a flowchart of a method for determining a duty cycle offset of a periodic signal according to an embodiment of the present invention.

FIG. 3 shows a flowchart of a method for determining a duty cycle offset of a periodic signal according to an embodiment of the present invention. The method may begin in operation 310 in which a periodic signal may be inverted to form an inverted periodic signal. The inverted periodic signal may have the same duty cycle as the periodic signal. The method may continue to operation 320 in which the periodic signal may be operably connected to a ring oscillator that may have an odd number of ordered inverting elements. Each of the inverting elements may have an input port, an output port, and an enable port. The inverting elements may be arranged in a ring. Each inverting element's output port (except the last inverting element) may be operably connected to the subsequent inverting element's input port. The last inverting element's output port may be operably connected to the first inverting element's input port. At least one of the inverting elements may be an inverting memory element. The periodic signal may be operably connected to the enable ports of the inverting elements. The method may continue to operation 330 in which the output ports of the inverting elements may start oscillating. The oscillations may occur during the high portion of the periodic signal. The method may continue to operation 340 in which a first number of oscillations of an inverting element's output port may be counted. After operation 340, the ring oscillations of the output ports of the inverting elements may be stopped. The method may continue to operation 350 in which the inverted periodic signal may be operably connected to the enable ports of the inverting elements. The method may continue to operation 360 in which the output ports of the inverting elements may start oscillating. The oscillations may occur during the low portion of the periodic signal. The method may continue to operation 370 in which a second number of oscillations of the inverting element's output port may be counted. The method may continue to operation 380 in which the difference between the first number of oscillations and the second number of oscillations may be determined. The method may continue to operation 390 in which the difference between the first number of oscillations and the second number of oscillations may be used to correct a duty cycle of the periodic signal to a desired duty cycle.

Embodiments of the present invention described above may be useful for determining a duty cycle offset, but the granularity may be very coarse. For example, using the same values as above, if the periodic signal is at logic '1' for 200 picoseconds, the counter still only increments by 3. Similarly, if the periodic signal is at logic '0' for 130 picoseconds, the counter still only decrements by 2. Thus, the result for a high portion/low portion ratio of 170:150 is the same as the high portion/low portion ratio of 200:130.

To further improve embodiments of the present invention, the measurement of the periodic signal's duty cycle offset may be based on an evaluation of a plurality of cycles of the periodic signal. Thus, the counter may be incremented for several high portions of the periodic signal before being decremented for an equal number of low portions of the periodic signal. For example, the counter may be incremented for 2 clock high portions of the periodic signal before being decremented for 2 low portions of the periodic signal. To clarify, the starter may not stop or restart the ring oscillator until all the high portions (or low portions) have occurred. Thus, in the example above, the ring oscillator may not be stopped or restarted between the first high portion and the second high portion. When the periodic signal becomes logic '0' between the two high portions, the ring oscillator may be "frozen" in that the ring oscillator may stop oscillating and remain in the state it was in immediately before the falling edge of the clock. Additionally, because a plurality of cycles of the periodic signal are being considered, it may no longer be necessary for the starter to start or stop the ring oscillator exactly when the periodic signal transitions to logic '1' or logic '0'.

If the counter is incremented/decremented for c number of cycles of the periodic signal, the total number of inversion of the inverting elements is c*ROUND(h/d). Thus, the counter is incremented/decremented by INT(c*ROUND(h/d)/(2*n)). If the high portion/low portion ratio is 170:150 and the counter is incremented/decremented for 16 clock cycles (d is 8.8 picoseconds, n is 3), the counter is incremented 50 times for the high portion of the periodic signal and decremented 45 times for the low portion of the periodic signal. If the high portion/low portion ratio is 200:130, the counter is incremented 61 times for the high portion of the periodic signal and decremented 40 times for the low portion of the periodic signal. In this embodiment of the present invention, a duty cycle offset of +20 picoseconds, for 170:150, results in a counter end value of 5 while a duty cycle offset of +70 picoseconds, for 200:130, results in a counter end value of 21. As before, the end result in the counter may be proportional to the actual duty cycle offset. However, due to the granularity of the process, different duty cycle offsets may still result in the same counter end result.

Aside from improved granularity, another advantage of using multiple clock cycles may be that the periodic signal's jitter may average out over a number of cycles. Thus, the variability inside the ring oscillator may be unimportant. The same transistors, in the same environment may be used to measure the high portion and the low portion. Noise effects may cancel out in time if the circuit does not do something radically different between measuring the high portion and measuring the low portion. The only variability that may not be canceled out is the "perfectly symmetrical inverter" variability and any other variability that occurs over the course of measurement (i.e., over approximately 1 microsecond). The embodiment may not get warmer during such a short time. The metastability inside the oscillator may be unimportant. For example, the voltage may be brought down to a known value when the latch closes. Other advantages are possible.

Figure 4:
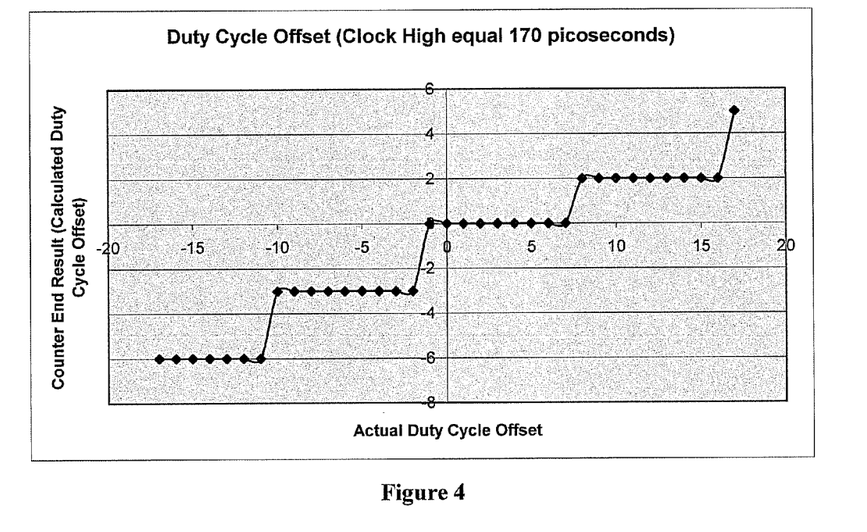
FIG. 4 shows a counter end result for an embodiment of the present invention in which d is 8.8 picoseconds, n is 3, c is 16, and the high portion of a periodic signal is 170 picoseconds while the low portion of the periodic signal varies from 153 picoseconds to 187 picoseconds.

FIG. 4 shows a counter end result for an embodiment of the present invention in which d is 8.8 picoseconds, n is 3, c is 16, and the high portion of a periodic signal is 170 picoseconds while the low portion of the periodic signal varies from 153 picoseconds to 187 picoseconds. A perfect duty cycle offset detection system would be linear (or at least linear over a predefined range). In other words, the counter end value would be different for each duty cycle offset.

The accuracy of the embodiments of the present invention may be further improved by implementing a controllable extra delay (e.g., an extra propagation delay) inside each inverting element. The delay may be switchable (i.e., on or off), or the delay may be tunable (i.e., a number between two values). If the delay is switchable, the delay may be d if the controllable delay is off and may be d+ed if the controllable delay is on. If there are n inverter elements, for the entire ring oscillator there are n+1 delay combinations: a delay of n*d, a delay of ed+(n−1)*d, . . . , n*(d+ed). Each delay combination may result in a different number of oscillations of the output port of an inverting element. For example, for 3 inverter elements (n) each having a delay of 8.8 picoseconds (d), a high portion of 170 picoseconds (h) being measured over 16 clock cycles (c), and no extra delays the counter will be incremented 50 times. However, if every inverting elements' extra delay is turned on, and the extra delay is 0.44 picoseconds (ed), the counter will be incremented 48 times. If each delay combination is measured for c clock cycles, the counter may be incremented by a different amount for one or more of the delay combinations. This variability may increase the accuracy of embodiments of the present invention. Because each delay combination may be measured over c clock cycles, the total number of oscillations may be calculated by using an "average" inverting element which has an average delay equal to the fixed delay, d, plus the average added extra delay per inverting element, $(ed*i)/n$, where i is the total number of inverting elements with the extra delay turned on. Thus, the total number of oscillations (the number of times the counter is incremented or decremented) is the sum of $INT(c*ROUND(h/(d+(ed*i)/n))/(2*n))$, for i=0 to n.

Figure 5:
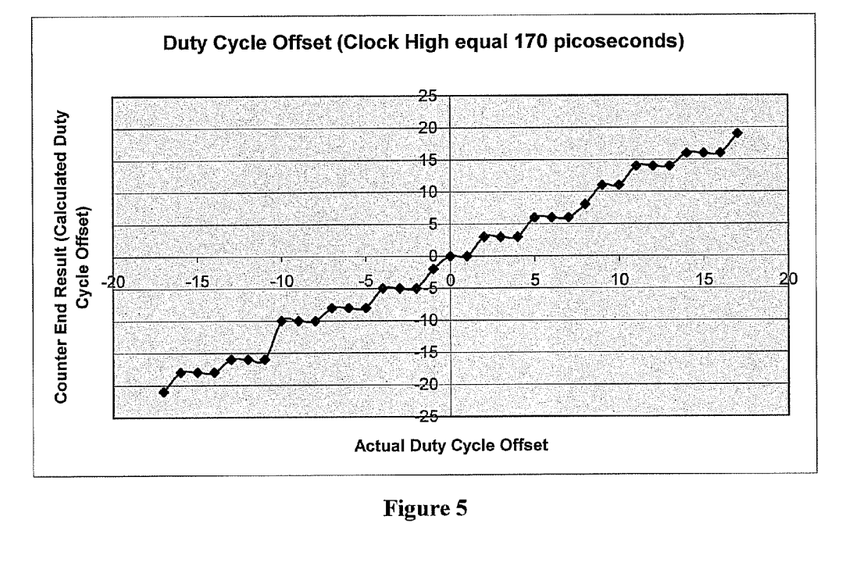
FIG. 5 shows a counter end result for an embodiment of the present invention in which d is 8.8 picoseconds, n is 3, c is 16, ed is 0.44 picoseconds, and the high portion of a periodic signal is 170 picoseconds while the low portion of the periodic signal varies from 153 picoseconds to 187 picoseconds.
Figure 6:
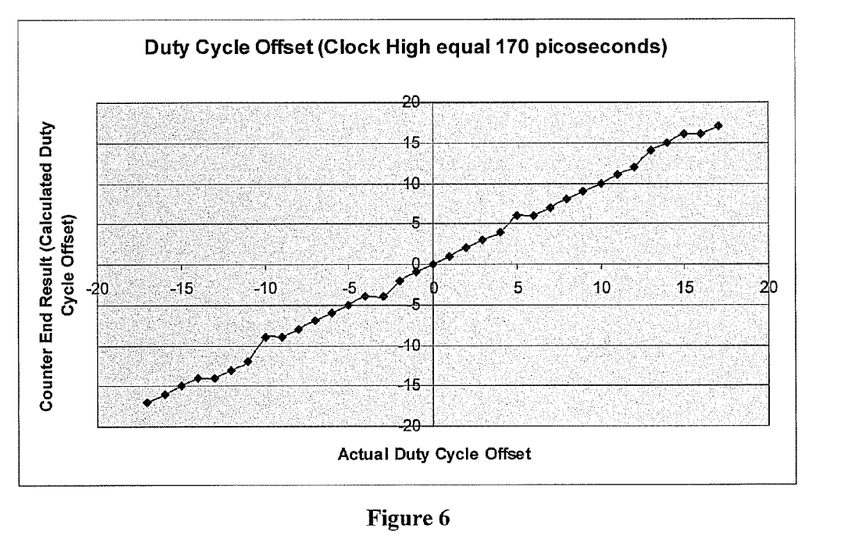
FIG. 6 shows a counter end result for an embodiment of the present invention in which d is 8.8 picoseconds, n is 7, c is 16, ed is 0.44 picoseconds, and the high portion of a periodic signal is 170 picoseconds while the low portion of the periodic signal varies from 153 picoseconds to 187 picoseconds.

FIG. 5 shows a counter end result for an embodiment of the present invention in which d is 8.8 picoseconds, n is 3, c is 16, ed is 0.44 picoseconds, and the high portion of a periodic signal is 170 picoseconds while the low portion of the periodic signal varies from 153 picoseconds to 187 picoseconds. As is readily apparent, FIG. 5 shows less granularity and increased accuracy as compared to FIG. 4. It should be emphasized that the only difference between FIG. 4 and FIG. 5 is that the embodiment of FIG. 5 uses delay combinations. When delay combinations are employed, it may be advantageous to have more inverting elements. Since more inverting elements means more delay combinations, there may be more variability in the number of oscillations produced by each delay combination. As mentioned above, this increased variability may result in reduced granularity and increased accuracy. FIG. 6 shows a counter end result for an embodiment of the present invention in which d is 8.8 picoseconds, n is 7, c is 16, ed is 0.44 picoseconds, and the high portion of a periodic signal is 170 picoseconds while the low portion of the periodic signal varies from 153 picoseconds to 187 picoseconds. The embodiment of FIG. 6 is nearly linear and is thus nearly ideal for this periodic signal over this duty cycle offset range.

In embodiments of the present invention, the counter end result may be used by a duty cycle correction circuit to correct a periodic signal to a desired duty cycle offset (for example by tuning a clock generator). The clock generator may be tuned such that the resultant clock signal has a 50% duty cycle or as close to a 50% duty cycle as the accuracy of the embodiment allows (however, the duty cycle of the periodic signal may be tuned to any desired amount).

Embodiments of the present invention may be used to detect a duty cycle offset in any periodic signal such as a clock signal. The offset of the duty cycle may be detected relative to a 50% duty cycle or may be detected relative to any arbitrary desired duty cycle. Embodiments of the present invention may be operably connected to or used in a processor or any circuit having a periodic signal. Embodiments of the present invention may be used at the output of a Phase Locked Loop (PLL) in a processor or may be used to detect a duty cycle offset for clock signals that have branched off the main clock tree (which are highly susceptible to duty cycle excursions). For example, embodiments of the present invention may be used near a functional block of the processor. Embodiments of the present invention may be particularly well-suited for implementation near a functional block of a processor since only approximately 300 transistors or less may be required.

Figure 7:
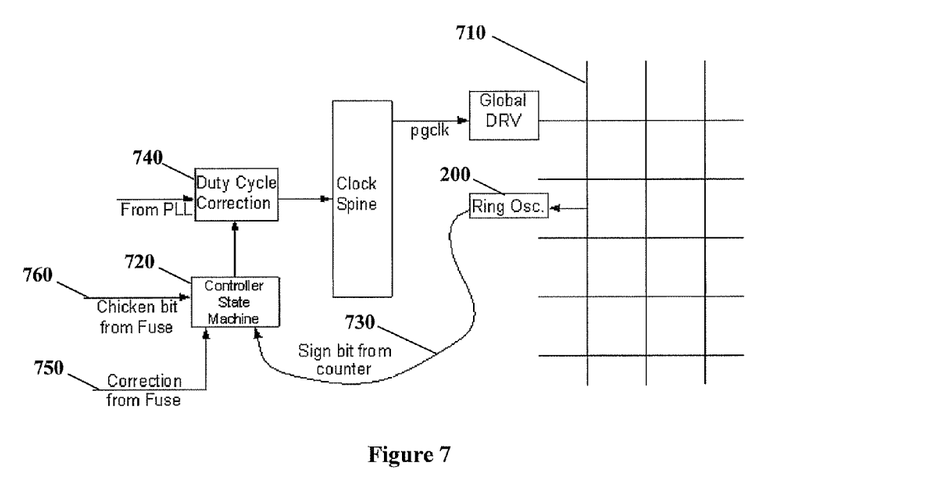
FIG. 7 shows an embodiment of the present invention used to monitor a clock signal.

FIG. 7 shows an embodiment of the present invention used to monitor a clock signal. The duty cycle offset may be measured directly from a clock grid 710 of a functional block. A controller state machine 720 (similar to the one used for de-skewing clocks) may use a sign bit 730 from a counter of a ring oscillator 200. The sign bit indicates if the measured duty cycle offset is positive or negative. Based on the sign bit, the controller state machine may change controls of a duty cycle correction circuit 740 until it reaches the point where the sign bit changes (i.e., from positive to negative or vice versa). Alternatively, the entire measured offset from the counter may be sent to the controller state machine as opposed to just the sign bit. The ring oscillator may be connected to the duty cycle correction circuit instead of, or in addition to, the controller state machine. The duty cycle correction circuit may add a variable delay to either the clock high portion or the clock low portion of the clock signal. For safety, it may be desirable to provide the ability to disable the ring oscillator and use a corrector value 750 from the prior art system that uses fuses. A "chicken bit" 760 (debug bit) may provide for this functionality. Thus, embodiments of the present invention may be backward compatible. Embodiments of the present invention may be controlled through a Test Access Point (TAP) using Joint Test Access Group (JTAG) technology. Alternatively, the measurement may be triggered by reset.

FIGS. 8-10 show duty cycle offset measurements for an embodiment of the present invention including 11 inverting elements (1 NAND gate and 10 transparent D latches). The x-axis represents the different duty cycle offsets that were tested. The y-axis represents the measured duty cycle offset. Each data point on the graphs represents a single simulation or experiment. Simulations and experiments were conducted for a variety of parameters such as the clock signal's clock cycle. The same line style is used to group together data points from simulations and experiments conducted using the same parameters. If the embodiment operated perfectly for a set of parameters, the line of data points for the set of parameters would be linear, having a slope of 1. If the clock signal is also perfect and thus has no inherent duty cycle offset, the line would also pass through the origin.

The measured duty cycle offset may be determined by the formula: measured offset=$(mn*(p/2))/(2*ms-mn)$, where ms is the value in the counter after the counter has been incremented (e.g., after counting the number of oscillations for the clock high portion of the clock signal), mn is the value in the counter after the counter has been incremented and then decremented (e.g., the difference between a first number of oscillations of an inverting element's output port in a first state of a switch when the clock signal is high and a second number of oscillations of the inverting element's output port in a second state of the switch when the clock signal is low), and p is the clock cycle time. This formula gives the correct measured offset in time (seconds) from a unit-less counter value. The formula also takes into account different properties of embodiments of the present invention by comparing the first state to the first state and second state. For example, a first embodiment may have a delay of d for each inverting element while a second embodiment may have a delay of d/2 for each inverting element. If the actual duty cycle offset is +3 picoseconds for a clock cycle time of 260 picoseconds, the clock high time is 133 picoseconds and the clock low time is 127 picoseconds. The first embodiment may have an ms of 133 and an mn of 6, the second embodiment may have an ms of 266 and an mn of 12. By plugging into the above formula it is clear that both embodiments properly calculated the duty cycle offset and that the end value of the counter divided by two (mn/2) is not always actually equal to the actual duty cycle offset.

Tuning the duty cycle of a processor clock closer to 50% can enhance the performance of the chip. Currently, this can be accomplished using fuses which store control information for a chain of inverting elements having controllable P/N ratios. The deficiency of this method is that each individual chip requires different fuse settings due to the variability and unpredictability of the process.

What is claimed is:

1. A device comprising:
    a ring oscillator having an odd number of ordered inverting elements, wherein each of said inverting elements has an input port, an output port, and an enable port, and wherein said inverting elements are arranged in a ring, and wherein at least one of said inverting elements is an inverting memory element;
    an inverter to form an inverted periodic signal from a periodic signal;
    a switch to operably connect said periodic signal to each of said inverting elements' enable port in a first state and to operably connect said inverted periodic signal to each of said inverting elements' enable port in a second state;
    a starter to start oscillations of said output ports of said inverting elements during said first state and during said second state; and
    a counter to count a first number of oscillations of one of said inverting elements' output port in said first state and a second number of oscillations of said one of said inverting elements' output port in said second state, wherein the difference between said first number and said second number is proportional to a duty cycle offset of said periodic signal.

2. The device of claim 1, wherein one of said inverting elements comprises a NAND gate.

3. The device of claim 1, wherein said inverting memory element comprises a transparent latch.

4. The device of claim 1, wherein said inverter's input rise time is substantially equal to said inverter's output fall time and said inverter's input fall time is substantially equal to said inverter's output rise time.

5. The device of claim 1, further comprising a duty cycle correction circuit to correct a duty cycle of said periodic signal to a desired duty cycle based on the difference between said first number of oscillations and said second number of oscillations.

6. The device of claim 1, wherein said switch is in said first state for one or more periods of said periodic signal, and wherein said switch is in said second state for said one or more periods of said inverted periodic signal.

7. The device of claim 1, wherein at least one of said inverting elements has a controllable extra delay.

8. The device of claim 1, wherein said device is included in a processor.

9. A method comprising:
    forming an inverted periodic signal from a periodic signal;
    operably connecting said periodic signal to a ring oscillator having an odd number of ordered inverting elements, wherein each of said inverting elements has an input port, an output port, and an enable port, and wherein said inverting elements are arranged in a ring, and wherein at least one of said inverting elements is an inverting memory element, wherein said periodic signal is operably connected to each of said inverting elements' enable port in a first state and operably connecting said inverted periodic signal to each of said inverting elements' enable port in a second state;
    starting oscillations of said output ports of said inverting elements during said first state and during said second state; and
    counting a first number of oscillations of one of said inverting elements' output port in said first state and a second number of oscillations of said one of said inverting elements' output port in said second state, wherein the difference between said first number and said second number is proportional to a duty cycle offset of said periodic signal.

10. The method of claim 9, wherein one of said inverting elements comprises a NAND gate.

11. The method of claim 9, wherein said inverting memory element comprises a transparent latch.

12. The method of claim 9, wherein said inverted periodic signal is formed by an inverter, and wherein said inverter's input rise time is substantially equal to said inverter's output fall time and said inverter's input fall time is substantially equal to said inverter's output rise time.

13. The method of claim 9, further comprising correcting a duty cycle of said periodic signal to a desired duty cycle based on the difference between said first number of oscillations and said second number of oscillations.

14. The method of claim 9, wherein said first state is for one or more periods of said periodic signal, and wherein said second state for said one or more periods of said inverted periodic signal.

15. The method of claim 9, wherein at least one of said inverting elements has a controllable extra delay.

* * * * *